United States Patent
Sharma et al.

(10) Patent No.: US 7,928,568 B2
(45) Date of Patent: Apr. 19, 2011

(54) NANOWIRE-BASED DEVICE HAVING ISOLATED ELECTRODE PAIR

(75) Inventors: Shashank Sharma, San Jose, CA (US); Theodore I Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 39 days.

(21) Appl. No.: 12/476,671

(22) Filed: Jun. 2, 2009

(65) Prior Publication Data

US 2009/0236588 A1 Sep. 24, 2009

Related U.S. Application Data

(62) Division of application No. 11/624,682, filed on Jan. 18, 2007, now Pat. No. 7,544,591.

(51) Int. Cl.
*H01L 23/48* (2006.01)
*H01L 23/52* (2006.01)
*H01L 29/40* (2006.01)

(52) U.S. Cl. ........ 257/750; 257/506; 257/627; 438/481; 438/486

(58) Field of Classification Search .............. 257/24, 257/506, 627, 750; 438/481, 482, 486, 488
See application file for complete search history.

(56) References Cited

U.S. PATENT DOCUMENTS

| | | | |
|---|---|---|---|
| 5,607,876 A | 3/1997 | Biegelsen | |
| 6,172,388 B1 | 1/2001 | Chuang | |
| 6,297,063 B1 | 10/2001 | Brown | |
| 6,395,608 B2 | 5/2002 | Shin | |
| 6,692,568 B2 | 2/2004 | Cuomo | |
| 6,737,939 B2 | 5/2004 | Hoppe | |
| 6,755,956 B2 | 6/2004 | Lee | |
| 6,870,235 B2 | 3/2005 | Abstreiter | |
| 6,882,051 B2 | 4/2005 | Majumdar | |
| 7,161,168 B2 | 1/2007 | Heath | |
| 7,307,271 B2 * | 12/2007 | Islam et al. ............. 257/14 |
| 7,400,665 B2 * | 7/2008 | Wang et al. ............. 372/50.124 |
| 2002/0117659 A1 | 8/2002 | Lieber | |
| 2003/0089899 A1 | 5/2003 | Lieber | |
| 2004/0023253 A1 | 2/2004 | Kunwar | |
| 2004/0075464 A1 | 4/2004 | Samuelson | |
| 2005/0161662 A1 | 7/2005 | Majumdar | |
| 2007/0015346 A1 | 1/2007 | Cohen | |
| 2007/0120167 A1 * | 5/2007 | Duan et al. ............. 257/296 |
| 2007/0290370 A1 * | 12/2007 | Sharma et al. ............. 257/784 |

OTHER PUBLICATIONS

International Search Report; PCT Patent Application No. PCT/US2008/000578, filed Jan. 16, 2008; search issued by Korean Patent Office (ISA) Sep. 30, 2008.

* cited by examiner

*Primary Examiner* — Phuc T Dang

(57) ABSTRACT

A nanowire-based device includes the pair of isolated electrodes and a nanowire bridging between respective surfaces of the isolated electrodes of the pair. Specifically, the nanowire-based device having isolated electrodes comprises: a substrate electrode having a crystal orientation; a ledge electrode that is an epitaxial semiconductor having the crystal orientation of the substrate electrode; and a nanowire bridging between respective surfaces of the substrate electrode and the ledge electrode.

18 Claims, 6 Drawing Sheets

NANOWIRE-BASED DEVICE HAVING ISOLATED ELECTRODE PAIR

CROSS-REFERENCE TO RELATED APPLICATION

The present application is a divisional application of application Ser. No. 11/624,682, filed Jan. 18, 2007, issued as U.S. Pat. No. 7,544,591 B2, the contents of which are hereby incorporated herein by reference in their entireties.

BACKGROUND

1. Technical Field

The invention relates to nanotechnology. In particular, the invention relates to forming a pair of isolated electrodes that have the same crystal orientation and a device having a nanowire that interconnects the electrode pair.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having at least one linear dimension between 1 nm and 200 nm. These nano-scale structures are often 5 to 100 times smaller than conventional semiconductor structures.

Nanowires are building blocks of many nano-scale devices, such as nano-scale field effect transistors (FETs), p-n diodes, light emitting diodes (LEDs) and nanowire sensors, to name a few. However, efforts to integrate nanowires into device structures essentially have been limited to a research environment; these efforts are not conducive to, and not suitable for, reproducible mass-fabrication of nano-scale devices in a manufacturing environment.

BRIEF SUMMARY

In some embodiments of the present invention, a method of creating isolated electrodes in a nanowire-based device is provided. The method of creating isolated electrodes comprises providing a substrate that comprises a semiconductor layer having a crystal orientation and an insulating film on a surface of the semiconductor layer. The insulating film has a window to expose a portion of the surface. The method of creating isolated electrodes further comprises selectively epitaxially growing a semiconductor feature from the semiconductor layer through the window. The semiconductor feature has a vertical stem and a ledge that have the crystal orientation of the semiconductor layer. The vertical stem is in contact with the semiconductor layer through the window and the ledge is a lateral epitaxial overgrowth (LEO) of the vertical stem on the insulating film. The method of creating isolated electrodes further comprises creating a pair of isolated electrodes from the semiconductor feature and the semiconductor layer.

In other embodiments of the present invention, a method of integrating a nanowire between isolated electrodes of a nanowire-based device is provided. The method of integrating a nanowire comprises providing a substrate that comprises a semiconductor layer having a crystal orientation and an insulating film on a surface of the semiconductor layer. The insulating film has a window that exposes a portion of the semiconductor layer surface. The method of integrating a nanowire further comprises selectively epitaxially growing a semiconductor feature from the semiconductor layer through the window. The semiconductor feature has a vertical stem and a ledge with the crystal orientation of the semiconductor layer. The vertical stem is in contact with the semiconductor layer through the window. The ledge is a lateral epitaxial overgrowth of the vertical stem on the insulating film. The method of integrating a nanowire further comprises creating a pair of isolated electrodes from the semiconductor feature and the semiconductor layer. The method of integrating a nanowire further comprises growing a nanowire to self-assemble between horizontal surfaces of the isolated electrodes of the pair.

In other embodiments of the present invention, a nanowire-based device is provided. The nanowire-based device comprises a substrate electrode having a crystal orientation; and a ledge electrode that is an epitaxial semiconductor having the crystal orientation of the substrate electrode. The ledge electrode is electrically isolated from and cantilevered above the substrate electrode. The nanowire-based device further comprises a nanowire bridging between respective surfaces of the substrate electrode and the ledge electrode.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
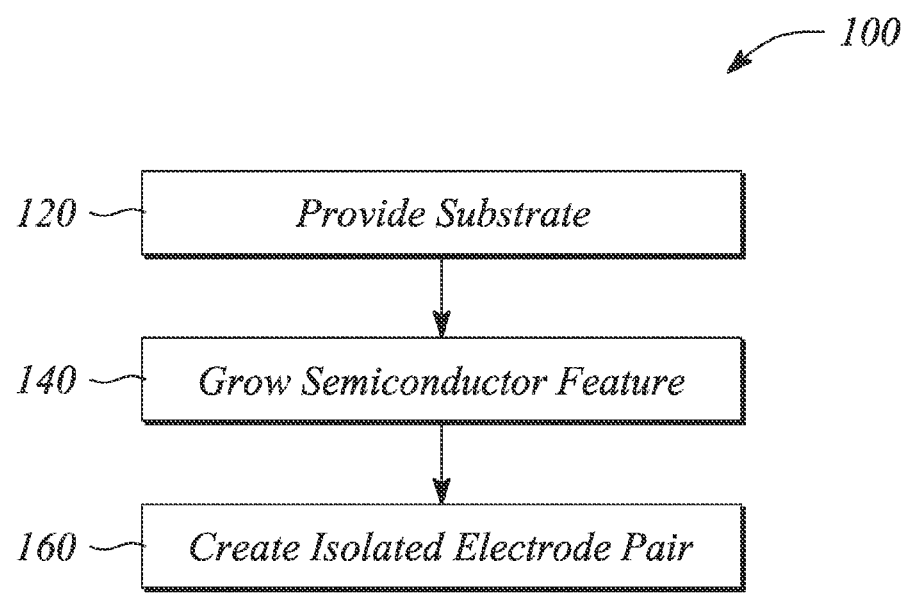
FIG. 1 illustrates a block diagram of a method of creating isolated electrodes in a nanowire-based device according to an embodiment of the present invention.

Embodiments of the present invention are directed to one or more of creating a pair of isolated electrodes having the same crystal orientation, integrating a nanowire between the isolated electrodes of the pair, and a nanowire-based device that has the isolated electrode pair and the integrated nanowire. By definition, the isolated electrodes of the pair are electrically isolated from one another and are vertically spaced apart in separate horizontal planes, as opposed to being electrodes in the same horizontal plane. The nanowire is grown from a horizontal surface of one of the electrodes to a facing horizontal surface of another of the electrodes of the pair. In some embodiments, the isolated electrodes of the pair both have a [111] oriented semiconductor crystal lattice. In other embodiments, the isolated electrodes of the pair have the same crystal orientation such as, but not limited to, a [110] orientation and a [100] orientation.

For example, if the horizontal surface from which the nanowire grows is a (111) surface of a [111] oriented semiconductor crystal lattice, then during nanowire growth, the nanowire will grow preferentially nearly normal to the (111) surface. On a horizontally oriented (111) surface, the nanowire will grow substantially vertically from the (111) surface. The nanowire will grow at least until it contacts the facing horizontal surface. Once contacted, the nanowire will attach or connect to the facing horizontal surface. A nanowire will attach to a facing horizontal surface that has any crystal orientation including, but not limited to, one of [110], [111] and [100] crystal lattice orientations for nanowire attachment. For example, M. Saiful Islam et al., U.S. Patent Publication No. 2006-00977389A1, published May 11, 2006, and Shih-Yuan Wang et al., U.S. CIP Patent Publication No. 2006-0098705A1, published May 11, 2006, both of which are incorporated herein by reference, describe vertical nanowire columns ('nano-colonades') that interconnect between horizontal surfaces of electronic device structures where the crystal orientation of the initiating surface is a (111) surface and the facing horizontal surface has any crystal orientation.

In contrast, for various embodiments of the present invention, the facing horizontal surface has a crystal orientation that is the same as the crystal orientation of the horizontal surface from which the nanowire growth is initiated by using selective epitaxial growth on the initiating horizontal surface to create the facing horizontal surface. The facing surface and the initiating surface are the horizontal surfaces of the isolated electrode pair according to the embodiments described herein. For simplicity of discussion herein and not by way of limitation, the isolated electrode pair is described herein as a [111] oriented semiconductor crystal to obtain growth of (111)-oriented nanowires perpendicular to the (111) horizontal surfaces of the electrodes, by way of example, with the understanding that other crystal orientations may be used herein with other oriented nanowires and still be within the scope of the various embodiments of the present invention. Among other things, various embodiments of the present invention may provide a massively parallel, self-assembly technique to integrate nanowire interconnections into a device capable of measuring a transducible property including, but not limited to, electrical conductance.

In accordance with various embodiments of the present invention, vertical nanowires are integrated between electrically isolated horizontal electrodes, wherein the respective electrodes are formed from (i.e., in or on) a semiconductor layer of a substrate and the electrodes have the same crystal orientation as the semiconductor layer. One of the electrodes is created using selective lateral epitaxial overgrowth (LEO) of a semiconductor material on the semiconductor layer. The other electrode is formed in the semiconductor layer. The LEO electrode is electrically isolated from the substrate electrode. The electrically isolated horizontal electrodes are within an electronic device structure including, but not limited to, a diode, a transistor, a sensor, an optical device and an optoelectronic device. In some embodiments, the various embodiments of the present invention may be used to fabricate the devices disclosed in U.S. Patent Publication Nos. 2006-00977389A1 and 2006-0098705A1, cited supra.

The use of brackets '[ ]' herein in conjunction with such numbers as '111' and '110' pertains to a direction or orientation of a crystal lattice and is intended to include directions '< >' within its scope, for simplicity herein. The use of parenthesis '( )' herein with respect to such numbers '111' and '110' pertains to a plane or a planar surface of a crystal lattice and is intended to include planes '{ }' within its scope for simplicity herein. Such use is intended to follow common crystallographic nomenclature known in the art.

The semiconductor materials useful for the various embodiments of the present invention include, but are not limited to, group IV, group III-V and group II-VI semiconductor materials, including compound semiconductor materials, from the Periodic Table of the Elements. As is further described below, the semiconductor material of the pair of isolated electrodes (also referred to as 'first electrode' and 'second electrode' or 'ledge electrode' and 'substrate electrode', respectively) can be the same or different semiconductor materials but have a same semiconductor crystal orientation. An insulator material useful for the various embodiments of the invention is any material that is capable of being made insulating including, but not limited to, a semiconductor material from the groups listed above, or another semiconductor material, or can be an inherently insulating material. Moreover, the insulator material may be an oxide, a carbide, a nitride or an oxynitride of any of those semiconductor materials, such that insulating properties of the material are facilitated. The semiconductor materials used to form the isolated electrodes, according to the various embodiments herein, are doped to impart a targeted amount of electrical conductivity for electrode applications (and possibly other characteristics for an intended purpose).

In some embodiments of the present invention, a method 100 of creating isolated electrodes in a nanowire-based device is provided. FIG. 1 illustrates a flow chart of the method 100 of creating isolated electrodes in a nanowire-based device according to an embodiment of the present invention. The method 100 comprises providing 120 a substrate that comprises a semiconductor layer having a crystal orientation. The semiconductor layer has a horizontal planar surface. For example and not by way of limitation, the crystal orientation of the semiconductor layer may be a (111)-oriented semiconductor. By definition, the (111)-oriented semiconductor crystal lattice has a horizontal surface that is a (111) plane. Other crystal orientations have {111} planes at other angles to the horizontal surface.

In some embodiments, the semiconductor layer is a bulk semiconductor wafer. In other embodiments, the semiconductor layer is a semiconductor layer on a support that is usually insulating (e.g., an oxidized silicon wafer). An example of a semiconductor layer on a support is a semiconductor-on-insulator wafer that comprises a handle wafer, an insulator layer on the handle wafer, and the semiconductor layer on the insulator layer, wherein the semiconductor layer has a horizontal planar surface. Hereinafter, the bulk semiconductor wafer and the semiconductor layer on a support will be collectively referred to as the 'semiconductor layer' for simplicity of discussion with the understanding that the term 'semiconductor layer' means either the bulk semiconductor wafer or the semiconductor layer on a support, as defined above, unless otherwise noted.

The semiconductor material of the semiconductor layer includes, but is not limited to, those semiconductor materials listed above, or another semiconductor material that forms any crystal orientation. For example, and not by way of limitation, the semiconductor layer may be a silicon-on-insulator (SOI) wafer with a (111)-oriented silicon layer (i.e., top layer), or a single, free-standing wafer of (111) silicon, depending on the embodiment.

According to the method 100 of creating isolated electrodes, the provided 120 substrate further comprises a patterned insulating film on the horizontal surface of the semiconductor layer. The patterned insulating film has a window that exposes the horizontal surface of the semiconductor layer. In some embodiments, an insulating film is formed on the semiconductor layer surface by growing an insulating material on the surface, such as by using thermal oxidation to form an insulating oxide film or layer. In other embodiments, the insulating material is deposited on the surface using chemical vapor deposition (CVD), such as thermal CVD or plasma enhanced chemical vapor deposition (PECVD), for example and not by way of limitation.

Figure 2A:
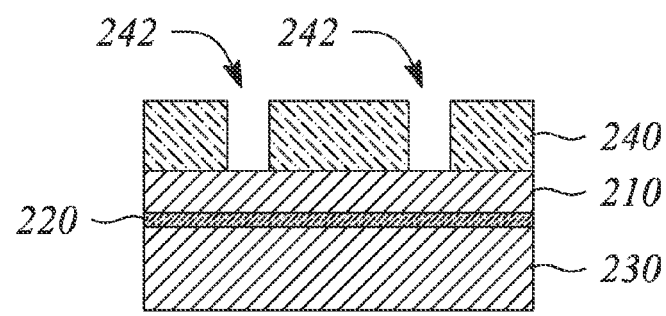
FIG. 2A illustrates a cross-sectional view of a device structure having a patterned insulating film of the method of FIG. 1 according to an embodiment of the present invention.

The formed insulating film is patterned, such that one or more windows (e.g., trenches, holes and other shaped features) are opened through the insulating film to expose the underlying semiconductor layer surface through the window. FIG. 2A illustrates a cross-sectional view of a device structure comprising the substrate that is provided 120 in the method 100 of creating isolated electrodes according to an embodiment of the present invention. In FIG. 2A, the semiconductor layer 210 is illustrated as a semiconductor layer of a semiconductor-on-insulator wafer by way of example and not by way of limitation. The semiconductor layer 210 may be either the bulk semiconductor wafer or the semiconductor layer on a support, as mentioned above, unless otherwise noted for an embodiment. In the illustrated embodiment, the substrate further comprises an insulator layer 220 and a handle wafer 230 (i.e., the support) that is separated from the semiconductor layer 210 by the insulator layer 220.

The provided 120 substrate further comprises the patterned insulating film 240 formed on the horizontal surface of the semiconductor layer 210. The patterned insulating film 240 has a window 242. In FIG. 2A, two windows 242 are illustrated by way of example and not by way of limitation herein. The patterned insulating film 240 may have only one window 242 or more than two windows 242 and still be within the scope of the various embodiments herein.

In some embodiments, the insulating film 240 is patterned to form the windows 242 using photolithography and a directional dry etching technique. Dry etching techniques include, but are not limited to, reactive ion etching (RIE), ion milling and plasma etching. RIE is a specialized plasma dry chemical process that achieves material removal anisotropically. Ion milling is a form of ion beam dry physical material-removal process that is inherently anisotropic. On the other hand, plasma etching is an isotropic technique for removing material. Directional etching of the insulator film to form the window provides a targeted shape or angle to the sidewalls of the window, for example.

The insulator material of the insulating film includes, but is not limited to, those materials mentioned above for an insulator material, such as oxides, nitrides, carbides, or oxynitrides of any of the semiconductor materials listed above, or another material that is, or is rendered, insulating. Moreover, the insulator material of the insulating film is chosen for its selectivity with respect to epitaxial growth. In other words, the insulating film material is chosen to discourage nucleation of a semiconductor material during selective epitaxial growth, so that a polycrystalline material is unlikely to nucleate on the insulating film. In some embodiments, the insulating film material is chosen to avoid nucleation of a polycrystalline material on the insulating film surface during selective epitaxial growth of a semiconductor material. Selective epitaxial growth of a semiconductor material is described below with respect to growing 140 a semiconductor feature in accordance with the method 100 of creating isolated electrodes. By discouraging or in some embodiments, avoiding nucleation of the semiconductor material on the insulating film surface, a selective deposition of the epitaxial semiconductor material is promoted.

For example, nucleation of silicon (Si) on a silicon nitride ($Si_3N_4$) insulating film occurs more readily than nucleation of Si on a silicon dioxide ($SiO_2$) insulating film. Therefore, the selective epitaxial growth of Si on $SiO_2$ insulator material is more selective compared to the selective epitaxial growth of Si on $Si_3N_4$ insulator material for the various embodiments herein. In some embodiments, a $Si_3N_4$ insulator material may be used for the insulating film with certain process constraints to compensate for nucleation of polycrystalline Si on the $Si_3N_4$ insulating film compared to a $SiO_2$ insulating film. For example, a range of process parameters, such as one or more of a Si/Cl ratio of gases, temperature, and pressure that are used for selective epitaxial growth of Si, would be different when using each of $Si_3N_4$ and $SiO_2$ insulator materials for the insulating film for example, but both are within the scope of the various embodiments herein. For the purpose of simplicity herein, and not by way of limitation, some embodiments of the invention may be described for a silicon semiconductor layer 210 and a $SiO_2$ insulating film layer 240 on the silicon layer surface.

Figure 2B:
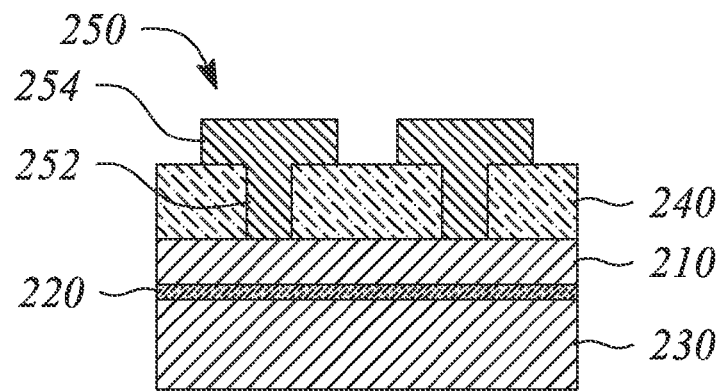
FIG. 2B illustrates a cross-sectional view of the device structure of FIG. 2A further having semiconductor features of the method of FIG. 1 according to an embodiment of the present invention.

The method 100 of creating isolated electrodes further comprises growing 140 a semiconductor feature in the window from (i.e., on) the semiconductor layer using selective and lateral epitaxial growth of a semiconductor material, such that the semiconductor feature extends through the window onto the adjacent surface of the insulating film. As such, the semiconductor feature has the same crystal orientation as the semiconductor layer. By definition, 'selective epitaxial growth' means that the semiconductor material grows epitaxially only on the exposed semiconductor material (i.e., on the semiconductor material itself as it forms), but does not grow or nucleate on the insulating film. For example, selective epitaxial growth avoids deposition of a polycrystalline semiconductor material on the insulating film surface, as mentioned above. FIG. 2B illustrates a cross-sectional view of the device structure of FIG. 2A, wherein semiconductor features 250 are grown 140 using the method 100 of FIG. 1 according to an embodiment of the present invention. FIG. 2B illustrates two such semiconductor features 250 in accordance with the two windows 242 that are illustrated in FIG. 2A by way of example and not by way of limitation.

The semiconductor feature 250 includes a vertical stem portion 252 that is formed in the window 242 and a ledge portion 254 that extends on the insulating film 240 surface continuous with the vertical stem 252 using lateral epitaxial overgrowth (LEO). In some embodiments, the semiconductor feature 250 has a 'T' cross-sectional shape, as illustrated in FIG. 2B. In some embodiments, thermal CVD is used to selectively epitaxially grow 140 the semiconductor feature 250. The epitaxial semiconductor material is grown 140 in the window 242 to a thickness that exceeds a thickness of the insulating film layer 240. The selective epitaxial growth 140 continues laterally onto the insulating film 240 surface as overgrowth (i.e., LEO) until a targeted dimension of the ledge portion 254 of the semiconductor feature 250 is achieved. For adjacent semiconductor features 250, as illustrated in FIG. 2B, a targeted dimension of the ledges 254 effectively leaves a gap between the adjacent ledges 254, for example.

The method 100 of creating isolated electrodes further comprises creating 160 an isolated electrode pair from the semiconductor feature and the semiconductor layer, the electrodes of which are vertically spaced apart and electrically isolated from one another. Creating 160 an isolated electrode pair comprises electrically isolating at least a portion of the semiconductor feature from the semiconductor layer; creating a first electrode from the ledge portion of the semiconductor feature, wherein the ledge portion is vertically spaced from the semiconductor layer; and creating a second electrode from (i.e., in) the semiconductor layer. The first electrode and the second electrode form a pair of isolated electrodes of the nanowire-based device, wherein the electrodes have the same crystal orientation. FIGS. 3A-3B, 4A-4B and FIGS. 5A-5C illustrate cross-sectional views of respective device structures of FIG. 2B during creating 160 an isolated electrode pair from the semiconductor feature and the semiconductor layer using the method 100 of FIG. 1 according to various embodiments of the present invention. Depending on the embodiment, the second electrode either is common among respective electrode pairs (e.g., interconnected regions of the semiconductor layer) or is a region of the semiconductor layer that is electrically isolated from other second electrode regions of respective electrode pairs.

The first electrode and the second electrode of the pair are rendered electrically conductive at any time during the method 100 of creating isolated electrodes. For example, the semiconductor feature and the semiconductor layer are rendered electrically conductive before the isolated electrodes are created 160 either separately or simultaneously depending on the embodiment. In some embodiments, the semiconductor layer is rendered electrically conductive before the semiconductor feature is epitaxially grown 140. In other embodiments, the semiconductor feature is rendered electrically conductive during selective epitaxial growth 140 thereof. In another example, the first electrode and the second electrode are rendered electrically conductive after the creation 160 thereof either separately or simultaneously, depending on the embodiment. A doping technique may be used to render the structures electrically conductive in accordance with the various embodiments of the present invention.

Figure 3A:
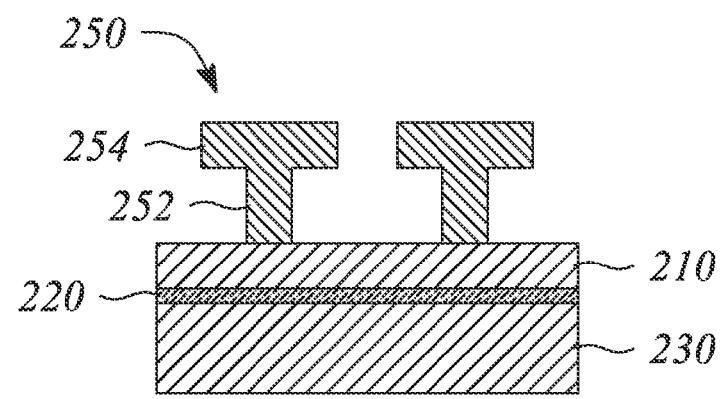
FIGS. 3A-3B illustrate cross-sectional views of the device structure of FIG. 2B during creating isolated electrodes of the method of FIG. 1 according to an embodiment of the present invention.

In some embodiments of creating 160 an isolated electrode pair, creating a first electrode from the ledge portion comprises removing the insulating film, such that the semiconductor layer is exposed between the epitaxially grown semiconductor features. FIG. 3A illustrates the semiconductor features 250 remaining after removal of the insulating film 240 according to an embodiment of the present invention. The ledge portion 254 of the semiconductor feature 250 extends beyond (i.e., overhangs or cantilevers from) the vertical stem 252 a distance above the semiconductor layer 210 surface. The distance is essentially equal to the thickness of the insulating film 240 before removal (or i.e., a height of the vertical stem 252). The insulating film 240 is removed by selectively isotropic etching of the insulating film using either a wet chemical etching technique or a dry etching technique.

Figure 3B:
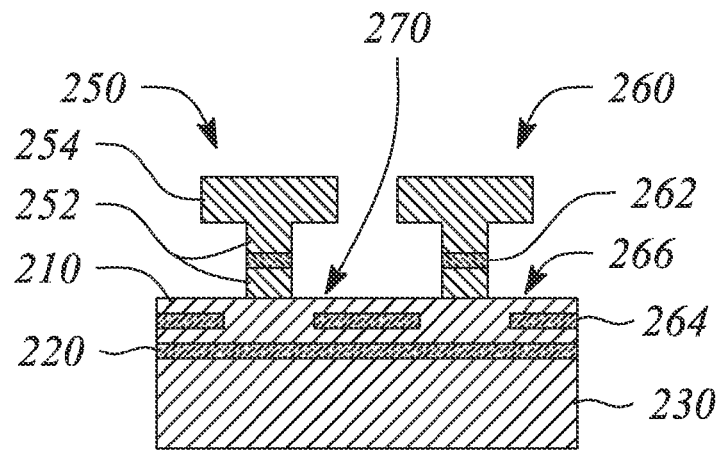

Creating a first electrode further comprises isolating portions of the semiconductor feature from one another by implanting a species into the semiconductor feature to form an isolation layer. In some embodiments, the species is oxygen and the implantation is similar to the separation by implanted oxide (SIMOX) technique. FIG. 3B illustrates the implanted isolation layer 262 in the vertical stem portion 252 of the semiconductor features 250 according to an embodiment of the present invention. The isolation layer 262 in the vertical stem portion 252 of the semiconductor feature 250 electrically isolates the ledge 254 from the semiconductor layer 210. The ledge 254 effectively is the first electrode 260. Depending on where the isolation layer is embedded during implantation, the first electrode 260 may include an adjacent part of the vertical stem 252 that is above the isolation layer 262, as illustrated in FIG. 3B.

In some embodiments, pockets of insulating species further may be formed in the semiconductor layer as a by-product of isolating portions of the semiconductor feature from one another by implantation. During oxide implantation, for example, pockets of oxide form in portions of the semiconductor layer 210 while the isolation layer 262 is formed in the vertical stem portion 252. As a result, the semiconductor layer 210 may comprise regions that are electrically insulating within the semiconductor layer 210 as a by-product of forming the isolation layer 262. FIG. 3B further schematically illustrates insulating pockets 264 in the semiconductor layer 210 according to an embodiment of the present invention by way of example and not by way of limitation.

As mentioned above, creating 160 an isolated electrode pair further comprises creating a second electrode from the semiconductor layer. Creating a second electrode comprises providing at least a portion of the semiconductor layer that faces the first electrode as the second electrode. In FIG. 3B, the semiconductor layer 210 further comprises an electrically conductive region 266 that is adjacent to the vertical stem portion 252 of the semiconductor feature 250. The region 266 is electrically isolated from, and the surface of region 266 faces, the ledge 254 (i.e., the first electrode 260). The semiconductor layer region 266 is effectively the second electrode 270 of the device structure that is electrically isolated from the first electrode 260. Hereinafter, the term 'first electrode' is used interchangeably with the term 'ledge electrode' and the term 'second electrode' is used interchangeably with the term 'substrate electrode' without any limitation being intended thereby.

Depending on where the isolation layer 262 is implanted, the second electrode 270 may include a part of the adjacent vertical stem 252 that is below the isolation layer 262 as well as the region 266 of the semiconductor layer, as illustrated in FIG. 3B. In some embodiments, the semiconductor layer regions 266 that form respective substrate electrodes 270 are not electrically isolated from one another, such that the second electrode 270 effectively is common among respective isolated electrode pairs 260, 270 while the ledge electrodes 260 are isolated from one another. In other embodiments, the semiconductor layer regions 266 are electrically isolated from one another such that the respective isolated electrode pairs 260, 270 each has a dedicated second electrode 270. Either a bulk semiconductor wafer or the semiconductor layer of a semiconductor-on-insulator wafer may be used as the semiconductor layer 210 in the embodiment illustrated in FIGS. 3A-3B.

In some embodiments, the device structure in FIG. 3B is further etched to separate adjacent second electrodes 270 of respective isolated electrode pairs 260, 270 from one another. For example, a region of the semiconductor layer 210 exclusive of the region 266 that becomes the electrode 270 is etched until the insulator layer 220 of the semiconductor-on-insulator wafer is exposed. The etched region is one or both of between the adjacent semiconductor features 250 and out from under the overhanging ledge 254. One or both of wet etching and dry etching may be used to achieve the separated adjacent isolated electrode pairs. In this embodiment, the second electrode 270 of an isolated electrode pair 260, 270 is physically and electrically isolated from adjacent second electrodes 270 in the semiconductor layer of respective other isolated electrode pairs 260, 270. Also in this embodiment, the semiconductor layer 210 is the semiconductor layer of a semiconductor-on-insulator wafer and the separate second electrodes 270 are similar to the second electrodes 270 illustrated in FIG. 5C, for example.

Figure 4A:
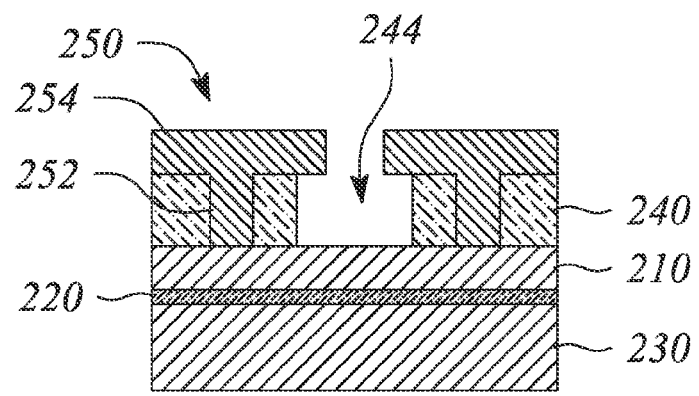
FIGS. 4A-4B illustrate cross-sectional views of the device structure of FIG. 2B during creating isolated electrodes of the method of FIG. 1 according to another embodiment of the present invention.

In another embodiment of creating 160 an isolated electrode pair, creating a first electrode from the ledge comprises opening a window in the insulating film adjacent to the ledge, wherein the window exposes the semiconductor layer surface. In some embodiments, the window is opened through the gap between the ledge portions of adjacent semiconductor features. FIG. 4A illustrates a cross-sectional view of the device structure of FIG. 2B with a window 244 opened in the insulating film 240 to expose the semiconductor layer 210 according to an embodiment of the present invention.

Opening a window comprises selective anisotropic etching of the insulating film, such that vertical sidewalls through the insulating film are formed. Opening a window in the insulating film further comprises isotropic wet chemical etching the insulating film in the window to form undercuts in the insulating film under the ledges of the adjacent semiconductor features. FIG. 4A further illustrates the insulating film 240 undercut below the ledges 254 in this embodiment. As a result, the ledges 254 extend beyond (i.e., overhang) the insulating film 240 and cantilever above the semiconductor layer 210. In some embodiments, both the vertical etch and the undercut etch can be performed using wet chemical etching where control of the shape of the recessed insulating film beneath the ledge structure is less of a consideration.

Figure 4B:
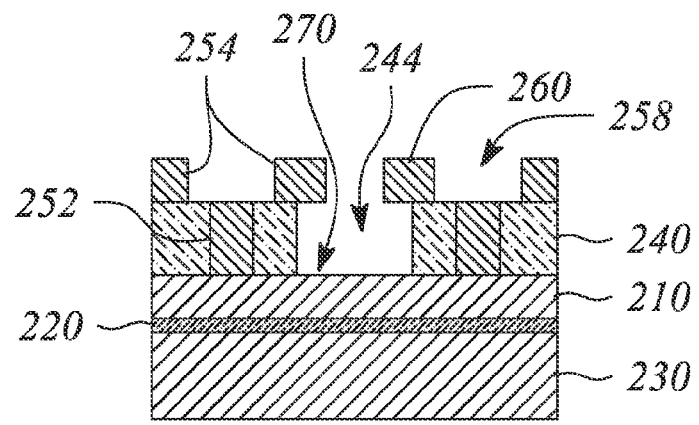

According to this embodiment, creating a first electrode from the ledge further comprises opening an aperture in the ledge that physically isolates a portion of the ledge from the vertical stem and the semiconductor layer. Opening an aperture comprises removing a part of the ledge above the vertical stem portion of the semiconductor feature using photolithography and etching, such that a remaining ledge portion is no longer continuous with the vertical stem but is supported by the insulating film. The remaining ledge is the physically isolated ledge portion that is both supported by and cantilevered from the insulating film and is referred to as 'the remaining ledge' for simplicity of discussion. FIG. 4B illustrates a cross-sectional view of the device structure of FIG. 4A with an aperture 258 formed in the ledge that separates the remaining ledge 254 from the respective vertical stem 252 and the semiconductor layer 210 according to an embodiment of the present invention. As such, the remaining ledge 254 is the first electrode 260 that is electrically (and physically) isolated from the vertical stem 252 and the semiconductor layer 210.

Creating a second electrode from the semiconductor layer comprises providing at least a portion of the semiconductor layer that faces the overhanging part of the remaining ledge (i.e., the first electrode) as the second electrode. FIG. 4B illustrates that the semiconductor layer 210 is the facing, second electrode 270 of the device structure. In some embodiments, the second electrode 270 effectively is common among respective isolated electrode pairs 260, 270 with separate, isolated ledge electrodes 260. In some embodiments, a portion of the semiconductor layer underneath the overhanging part of the remaining ledge is a specifically doped region of the semiconductor layer 210 that forms the facing, second electrode that is electrically isolated from adjacent specifically doped regions of the semiconductor layer. Either a bulk semiconductor wafer or the semiconductor layer of a semiconductor-on-insulator wafer may be used as the semiconductor layer 210 in the embodiment illustrated in FIGS. 4A-4B.

Figure 5A:
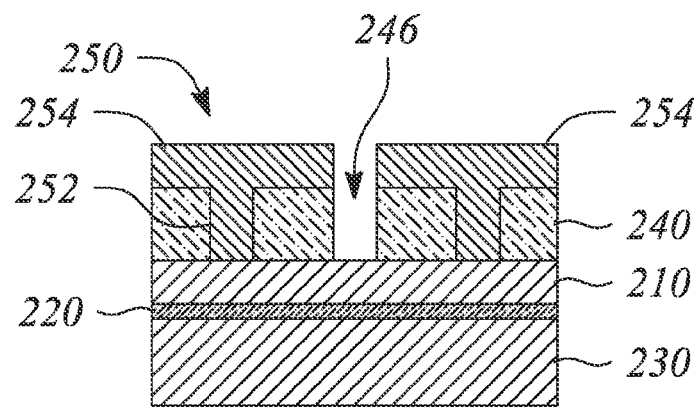
FIGS. 5A-5C illustrate cross-sectional views of the device structure of FIG. 2B during creating isolated electrodes of the method of FIG. 1 according to another embodiment of the present invention

In another embodiment of creating 160 an isolated electrode pair, creating a first electrode from the ledge comprises opening a first window in the insulating film adjacent to the ledge to expose a portion of the semiconductor layer. In some embodiments, the first window is opened through the gap between the ledge portions of adjacent semiconductor features. Opening a first window comprises selective anisotropic dry etching of the insulating film to form the first window in the insulating film with vertical sidewalls. FIG. 5A illustrates a cross-sectional view of the device structure of FIG. 2B in which a first window 246 is opened in the insulating film 240 according to an embodiment of the present invention. The first window 246 in the insulating film 240 exposes a portion of the semiconductor layer 210. In the embodiment illustrated in FIGS. 5A-C, the semiconductor layer 210 is a semiconductor layer 210 on a support. For example, the support includes a handle wafer 230 and an insulator layer 220 between the handle wafer 230 and the semiconductor layer 210, as described above for a semiconductor-on-insulator wafer.

Figure 5B:
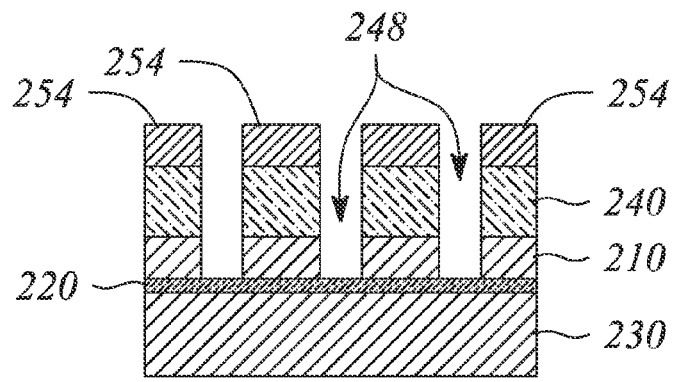

Creating a first electrode according to this embodiment further comprises opening second windows in the semiconductor layer having vertical sidewalls until a portion of the underlying insulator layer of the support is exposed. Opening second windows comprises using photolithography and a selective anisotropic dry etching technique to remove both a vertical portion of the semiconductor feature that includes a portion of the ledge above the vertical stem and the vertical stem, and to remove the semiconductor layer both under the removed vertical stem and exposed in the first window. In some embodiments, opening second windows comprises using a first patterned mask on a surface of the ledge that exposes the ledge above the vertical stem. The exposed ledge and the underlying vertical stem are removed by directional dry etching. Opening second windows further comprises using a second patterned mask that exposes the semiconductor layer. The semiconductor layer is removed from under the removed vertical stem and in the first window either simultaneously or separately using directional dry etching. In other embodiments, a first patterned mask is used to remove the exposed ledge and both the underlying vertical stem and the underlying semiconductor layer. A second patterned mask is used to remove the semiconductor layer exposed in the first window. In these embodiments, opening second windows removes both epitaxially grown semiconductor material and the semiconductor material of the semiconductor layer until the insulator layer is exposed in the second windows. FIG. 5B illustrates a cross-sectional view of the device structure of FIG. 5A in which second windows 248 are opened in the semiconductor layer 210 according to an embodiment of the present invention.

Opening first and second windows in the device structure results in spaced apart columns of the device structure, as illustrated in FIG. 5B. Each column comprises a portion of the semiconductor layer 210 adjacent to the insulator layer 220, a portion of the ledge 254, and a portion of the insulating film 240 between the semiconductor layer 210 portion and the ledge 254 portion. The insulating film 240 portion physically separates and electrically isolates the ledge 254 portion from the semiconductor layer 210 portion of each column.

Figure 5C:
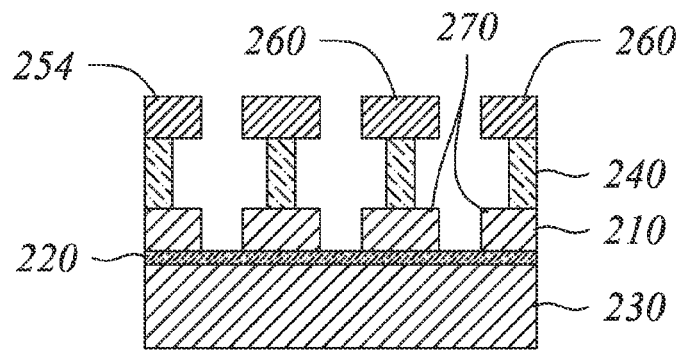

According to this embodiment, creating a first electrode further comprises etching the insulating film of the separate columns using selective, isotropic wet chemical etching to form undercuts in the insulating film between the ledge and the semiconductor layer of the respective column. As a result, the ledge overhangs (i.e., extends beyond) the insulating film and cantilevers above the semiconductor layer in the column. The respective ledge and the semiconductor layer of each column have facing (i.e., opposing) horizontal surfaces as a result of the undercut insulating film. In effect, the second electrode is created from the semiconductor layer during creating the first electrode from the ledge. The overhanging ledge in each column is the created first electrode; and the semiconductor layer of each column is the created second electrode of the nanowire-based device. The electrodes are vertically spaced apart and electrically isolated by the insulating film in each column. FIG. 5C illustrates a cross-sectional view of the device structure of FIG. 5B having a first electrode 260 and a second electrode 270 separated by an undercut insulating film 240 support according to an embodiment of the present invention.

In some embodiments, the method 100 of creating isolated electrodes further comprises growing a nanowire to interconnect between the isolated electrode pair of the device structure. Growing a nanowire is described with reference to a method of integrating a nanowire between isolated electrodes in a nanowire-based device described further below. As used herein, the article 'a' is intended to have its ordinary meaning in the patent arts, namely 'one or more'. For example, 'a nanowire' means 'one or more nanowires' and as such, 'the nanowire' means 'the nanowire(s)' herein. In this example, one nanowire or more than one nanowire may be grown to interconnect between a pair of isolated electrodes.

Figure 6:
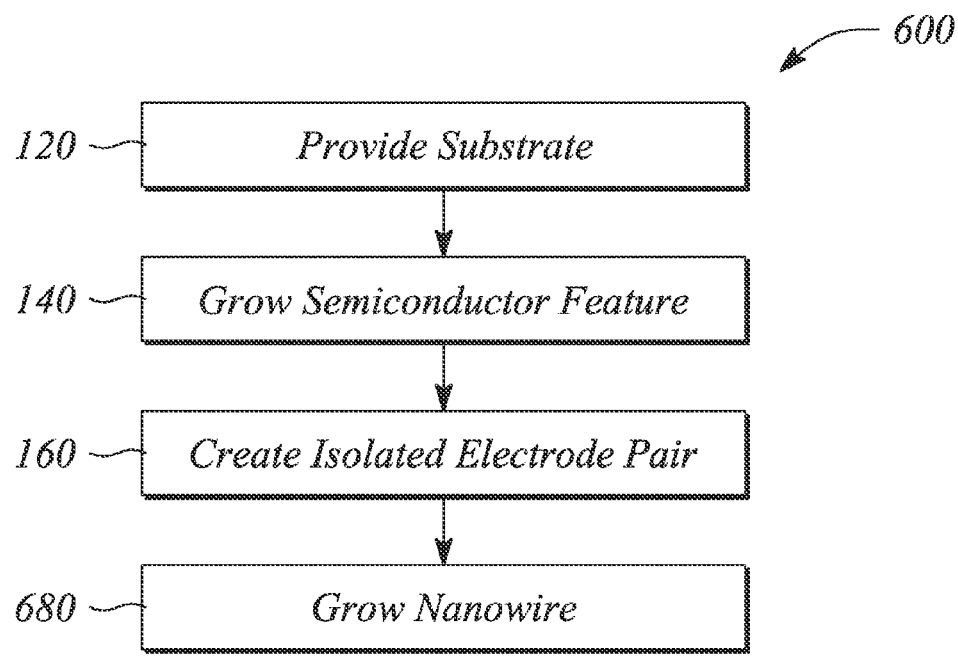
FIG. 6 illustrates a flow chart of a method of integrating a nanowire between isolated electrodes of a nanowire-based device according to an embodiment of the present invention.

In another embodiment of the present invention, a method of integrating a nanowire between isolated electrodes in a nanowire-based device is provided. FIG. 6 illustrates a flow chart of a method 600 of integrating a nanowire between isolated electrodes in a nanowire-based device according to an embodiment of the present invention. The method 600 of integrating a nanowire comprises providing 120 a substrate; growing 140 a semiconductor feature; and creating 160 an isolated electrode pair, all as described above for the method 100 of creating isolated electrodes, to create pairs of isolated electrodes of the nanowire-based device, wherein the electrode pairs have the same crystal orientation. The method 600 of integrating further comprises growing 680 a nanowire to self-assemble between the otherwise isolated device electrodes of a pair, such that the pair of isolated electrodes is electrically connected. The nanowire can be grown 680, such that one or more of length, diameter, shape, direction of growth, and position of the nanowire are controlled in accordance with some embodiments of the present invention. In some embodiments, nanowire growth provides for self-assembly of nanowires between the pairs of isolated electrodes in a massively parallel manner.

By definition, 'self-assembly' means that one of the ends of the nanowire originates as being connected to the surface of one of the isolated electrodes of a pair (i.e., is inherently anchored) during growth while the other end subsequently impinges on the facing surface of another isolated electrode of the pair and is connected to the other electrode when impinged. In other words, the nanowire is intrinsically anchored at one end during growth, extends from the surface until it ultimately anchors at an opposite end to self-assemble between facing surfaces of the isolated electrodes of the pair. As such, it is within the scope of the embodiments for the nanowire to originate from the surface of either the first electrode or the second electrode of an electrode pair and grow until it impinges and connects to the facing surface of the respective other electrode of the pair. The embodiments will be described below with respect to the nanowire growing from a (111) horizontal surface of the second electrode in a perpendicular direction to a facing (111) horizontal surface of the first electrode for simplicity of discussion only.

The nanowire has characteristic properties that impart different electrical, quantum, chemical and/or physical results that facilitate the function of the nanowire-based device. For example, the nanowire has a transducible property, such as electrical conductance, that can be measured at the isolated electrodes of the device, as mentioned above. A material of the nanowire is compatible with the materials of the device electrodes for a respective intended application.

The nanowire may be a metal material or may be a semiconductor material, either from any of the groups listed above or another semiconductor material. For example and not by way of limitation, the nanowire may be made from metal including, but not limited to, one or more of titanium (Ti), titanium-silicide ($TiSi_2$), bismuth (Bi), tellurium (Te), lead (Pb), aluminum (Al), palladium (Pd), platinum (Pt), and copper (Cu). In other examples, the nanowire may be one or more semiconductor materials including, but not limited to, silicon (Si), germanium (Ge), indium phosphide (InP), and gallium arsenide (GaAs), for example. Moreover, the nanowire may be a compound or alloy, for example. Numerous nanowire materials are known in the art. The scope of the various embodiments of the present invention is intended to include all such materials. Moreover, in some embodiments, a nanotube, such as a carbon nanotube (CNT), may be grown instead of a nanowire.

In some embodiments, the nanowire is a single crystal structure, while in other embodiments, the nanowire may be an amorphorous or multi-crystalline structure. Moreover, the nanowire may be homogeneous; or may be heterogeneous by comprising one or more segments of different nanowire materials along an axial length thereof. The nanowire may also have a core-shell structure in which a shell of one material surrounds a core nanowire of another material. In some embodiments, a semiconductor nanowire may be doped to impart a targeted amount of electrically conductivity or other property, depending on the application.

Nanowires are grown using a variety of techniques including, but not limited to, catalytic growth using vapor-liquid-solid (VLS) growth, catalytic growth using vapor-solid (VS) growth, catalytic growth using solution-liquid-solid (SLS) growth, and non-catalytic growth using vapor-phase epitaxy. Catalytic growth is further characterized by being either metal catalyzed or nonmetal catalyzed. In some embodiments, the growth is performed in a chemical vapor deposition (CVD) chamber in a controlled environment using a gas mixture comprising nanowire precursor materials that are introduced into the chamber. In other embodiments, other techniques also may be used to supply the material forming the growing nanowire, such as solution growth or laser ablation.

For catalyzed growth, a nanoparticle catalyst is formed on the surface of the semiconductor layer at a location from which the nanowire is to be grown. The nanoparticle catalyst accelerates decomposition of the nanowire precursor material in the gas mixture, such that atoms resulting from decomposition of a particular nanowire material-containing gas diffuse through or around the nanoparticle catalyst, and the atoms precipitate on the underlying semiconductor layer surface. The atoms of the nanowire material precipitate between the nanoparticle catalyst and the surface to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire. The nanowire growth is continued until the free end impinges on the facing horizontal surface of the first electrode.

Under the most common growth conditions, nanowires grow in <111> directions with respect to a crystal lattice and therefore, grow predominately perpendicular to a (111) surface (of a crystal lattice). For (111)-oriented horizontal surfaces, a nanowire will grow predominately vertically relative to the horizontal surface. On (111)-oriented vertical surfaces, a nanowire will grow predominately laterally (i.e., horizontally) relative to the vertical surface.

In order to grow 680 the nanowire using catalyzed growth, a nanoparticle catalyst is formed on the semiconductor layer surface in a location on the second or substrate electrode. In some embodiments, forming a nanoparticle catalyst comprises applying a catalyst material to the semiconductor layer surface using angled electron-beam (e-beam) evaporation, for example, to deposit the catalyst material under the overhanging ledge. In these embodiments, forming a nanoparticle catalyst further comprises annealing the catalyst material to form a catalyst nanoparticle. In other embodiments, forming a nanoparticle catalyst comprises using angled e-beam evaporation to directly deposit a nanoparticle catalyst on the semiconductor layer surface under the overhanging ledge, such that annealing is optional. For example, annealing removes any surface contaminates that may be present on the semiconductor layer surface and the facing horizontal surface of the isolated electrode pair. Alternatively, the nanoparticle catalyst can be added to the respective electrode surface by other means, such as solution deposition or gas-phase deposition of pre-formed catalyst nanoparticles.

Typical catalyst materials are metals and nonmetals. Metal catalyst materials include, but are not limited to, titanium (Ti), platinum (Pt), nickel (Ni), gold (Au), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy.

Figure 7A:
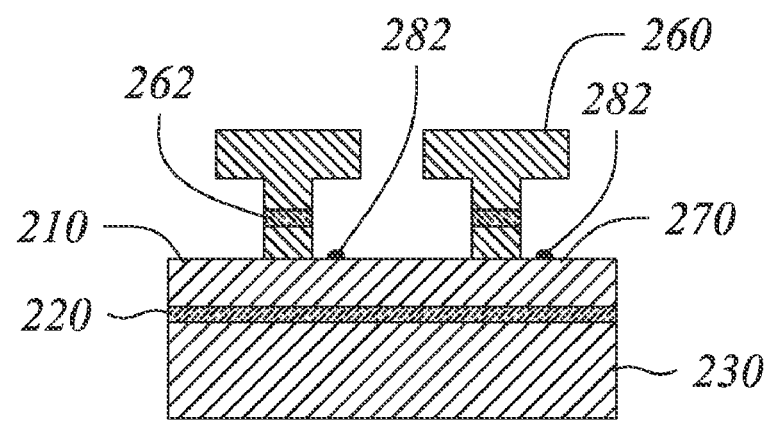
FIGS. 7A and 7B illustrate cross-sectional views of the device structure of FIG. 3B during integration of a nanowire of the method of FIG. 6 according to an embodiment of the present invention.
Figure 7B:
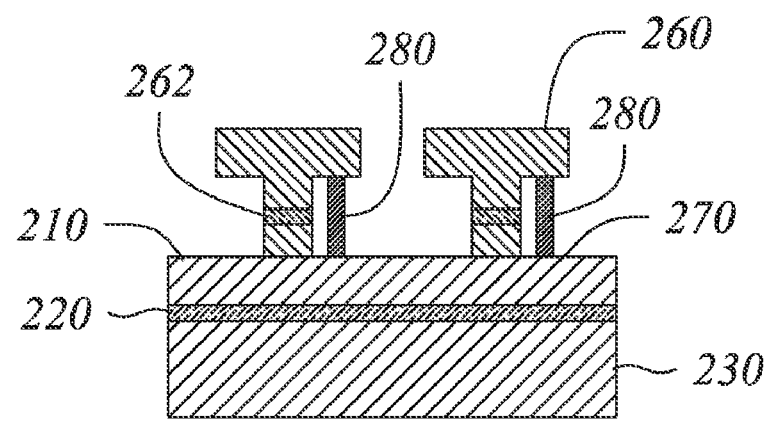

FIGS. 7A-7B illustrate cross-sectional views of the device structure of FIG. 3B during integration of a nanowire of the method 600 of FIG. 6 according to an embodiment of the present invention. In FIG. 7A, the nanoparticle catalyst 282 is formed on the second or substrate electrode 270 at a location underneath the overhanging first or ledge electrode 260 according to an embodiment of the present invention. FIG. 7B illustrates the nanowire 280 grown vertically from the location of the nanoparticle catalyst 282 on the (111) surface of the substrate electrode 270 to a facing horizontal surface of the ledge electrode 260 according to an embodiment of the present invention. The nanowire 280 effectively self-assembles to interconnect between the isolated electrode pair 260, 270 of the nanowire-based device.

In some embodiments, additional insulating film is removed from between the overhanging ledge electrode and the substrate electrode to provide sufficient spacing between the self-assembled nanowire and a sidewall of the undercut insulating film. The additional insulating film is optionally removed using short duration, selective, wet chemical etching or isotropic dry plasma etching to open a sufficiently wide gap between the nanowire and the insulating film. Sufficient spacing is determined by at least the function of the nanowire in the nanowire-based device. For example, and not by way of limitation, sensitivity of the nanowire in some nanowire-based sensors depends on an accessibility of the nanowire surface. When the undercut insulating film hinders access to some of the nanowire surface, then the gap is not sufficient and additional insulating film is optionally removed, as described above. An example of an embodiment where a gap 284 between the undercut insulating film 240 adjacent to the grown nanowire 280 may be widened by the above-mentioned selective etching, according to an embodiment of the present invention, is illustrated in FIG. 8B, which is described below with reference to a nanowire-based device 800.

In some embodiments, growing 680 a nanowire further comprises doping the nanowire to impart or enhance a targeted characteristic or property, such as electrical conductivity, charge-carrier depletion, and sensitivity. The nanowire may be doped one or both of during growth 680 and after the nanowire is grown between the pair of electrodes. In some embodiments, the isolated electrodes are doped either before or in conjunction with doping the nanowire. The isolated electrodes are doped to impart a targeted level of electrical conductance to the electrodes for the intended purpose of the nanowire-based device.

In another embodiment of the present invention, a nanowire-based device is provided. The nanowire-based device comprises a substrate electrode that has a crystal orientation. The substrate electrode is formed from (i.e., in) a semiconductor layer of a substrate, as described herein. In some embodiments, the semiconductor layer is a bulk semiconductor wafer and the substrate electrode is a region of the bulk semiconductor wafer with a horizontal surface. In other embodiments, the semiconductor layer is a semiconductor layer of a semiconductor-on-insulator wafer and the substrate electrode is a region of the semiconductor layer with a horizontal surface. The substrate electrode region is rendered electrically conductive by doping the region. In some embodiments, the substrate electrode is provided using the method 100 of creating isolated electrodes described above. Therefore, the substrate electrode has the same crystal orientation as that of the semiconductor layer, wherein the crystal orientation may be any crystal orientation. In some embodiments, the substrate electrode is formed in a (111) oriented semiconductor layer and therefore, has a [111] crystal orientation. In some embodiments, the substrate electrode is one electrode of an array of substrate electrodes that the nanowire-based device comprises.

The nanowire-based device further comprises a ledge electrode that is an epitaxial semiconductor of the semiconductor layer. The ledge electrode is electrically isolated from the substrate electrode. Moreover, the ledge electrode cantilevers above the substrate electrode. By 'epitaxial semiconductor' it is meant that the semiconductor material of the ledge electrode is a selective and lateral epitaxial growth of the ledge semiconductor material on the semiconductor layer that mimics the crystal lattice orientation of the semiconductor layer. Therefore, the ledge electrode has the same crystal orientation as the substrate electrode. In some embodiments, the ledge electrode is created using the method 100 of creating isolated electrodes described above. The ledge electrode is doped to render the ledge electrode electrically conductive. The ledge electrode forms an isolated electrode pair with a corresponding (i.e., facing) substrate electrode. In some embodiments, the ledge electrode is one electrode of an array of ledge electrodes that the nanowire-based device comprises and as such, the ledge electrodes and the corresponding substrate electrodes of the respective arrays form an array of isolated electrode pairs in these embodiments.

The nanowire-based device further comprises a nanowire that vertically bridges between the substrate electrode and the ledge electrode. The nanowire is grown to self-assemble between the substrate electrode and the ledge electrode of the isolated electrode pair. In some embodiments, the nanowire is grown between the isolated electrodes using the method 600 of integrating a nanowire described above. For example, nanowire growth comprises using a strategically placed nanoparticle catalyst on a (111) horizontal surface of a (111)-oriented substrate electrode and a controlled environment that includes a nanowire precursor material. The nanowire will grow and self-assemble between (111)-oriented electrodes with one end anchored to the substrate electrode surface at a location of the nanoparticle catalyst and with another end anchored to a facing (111) horizontal surface of the ledge electrode.

Figure 8A:
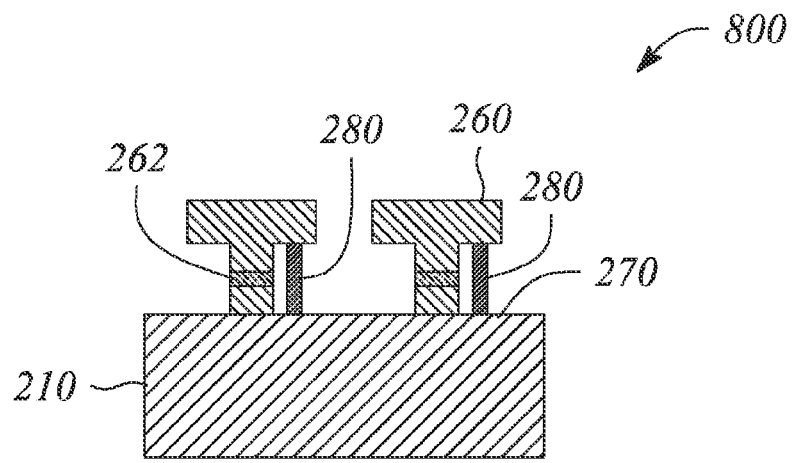
FIGS. 8A-8C illustrate cross-sectional views of nanowire-based devices according to various embodiments of the present invention.
Figure 8B:
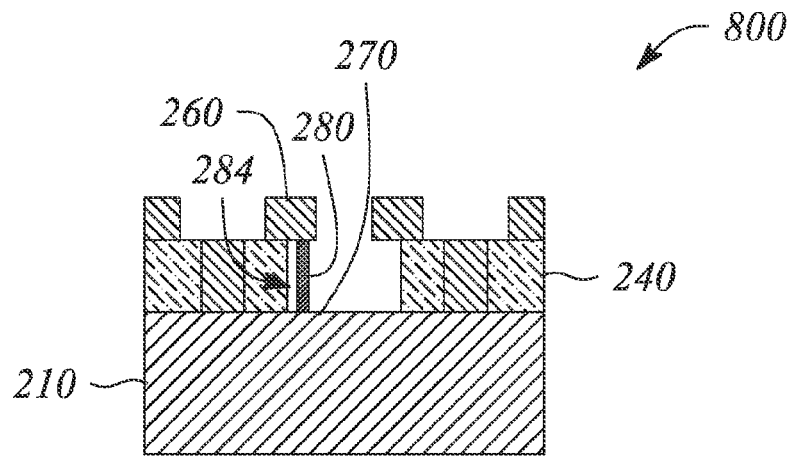
Figure 8C:
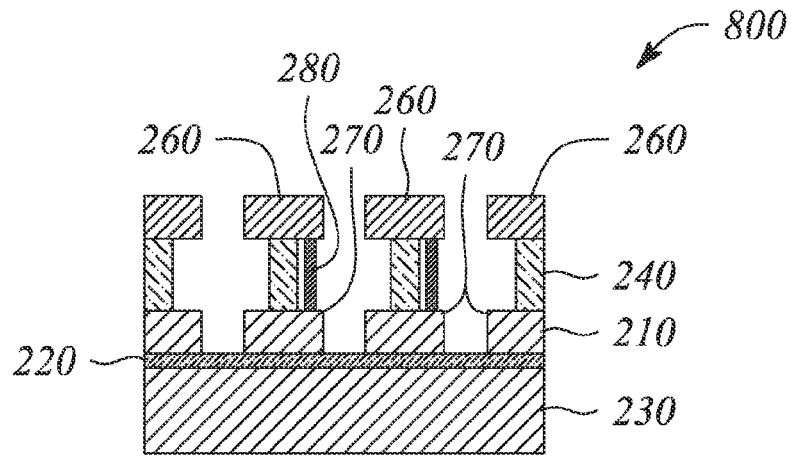

FIGS. 8A-8C illustrate cross-sectional views of nanowire-based devices 800 according to various embodiments of the present invention. The nanowire-based device 800 of FIG. 8A is essentially the device structure depicted in FIG. 7B but with a semiconductor layer 210 that is a bulk semiconductor wafer instead of a semiconductor layer of a semiconductor-on-insulator wafer by way of example and not by way of limitation. The nanowire-based device 800 of FIG. 8B is essentially the device structure depicted in FIG. 4B that further includes a nanowire 280 integrated into the device structure in essentially the same way as described above for the method 600 of integrating, according to another embodiment. In FIG. 8B, the nanowire-based device 800 includes a semiconductor layer 210 that is a bulk semiconductor wafer in this embodiment instead of a semiconductor layer of a semiconductor-on-insulator wafer that is illustrated in FIG. 4B also by way of example and not by way of limitation. The nanowire-based device 800 of FIG. 8C is essentially the device structure depicted in FIG. 5C that further includes a nanowire 280 integrated into the device structure also in essentially the same way as described above for the method 600 of integrating, according to another embodiment. Note that in the embodiment of the device 800 illustrated in FIG. 8C, the semiconductor layer 210 is the semiconductor layer of a semiconductor-on-insulator wafer as illustrated in and described above for FIG. 5C.

The nanowire 280 has a transducible property that is measured by probing the substrate electrode 270 and the ledge electrode 260. In some embodiments, the nanowire-based device 800 is a sensor device and the nanowire 280 is a means for sensing an environment to which the nanowire 280 is exposed. When the transducible property of the nanowire 280 changes due to a change in the environment, the sensor device detects the change by measuring the transducible property of the nanowire 280 between the substrate electrode 270 and the ledge electrode 260. The sensor device includes, but is not limited to, a nano-scale chemical sensor. In some embodiments, the nanowire-based device 800 is an electronic device and the nanowire 280 is a means for conducting an electrical signal along a path between the substrate electrode 270 and the ledge electrode 260. The electronic device includes, but is not limited to, a nano-scale transistor, a nano-scale diode and a nano-scale interconnecting conductor. In some embodiments, the nanowire-based device 800 is an optoelectronic device and the nanowire 280 is a means for converting an electrical signal into an optical signal upon stimulation by way of the substrate electrode 270 and the ledge electrode 260. The optoelectronic device includes, but is not limited to, a nano-scale laser. In some embodiments, the nanowire-based device 800 is a photodetector, such as a photodiode containing a p-n junction.

Thus, there have been described various embodiments of a method of creating isolated electrodes of a nanowire-based device, a method of integrating a nanowire between isolated electrodes of a nanowire-based device, and a nanowire-based device having a pair of isolated electrodes, wherein in each embodiment, the isolated electrode pair has a same crystal orientation. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A nanowire-based device having isolated electrodes comprising:
    a substrate electrode having a crystal orientation;
    a ledge electrode that is an epitaxial semiconductor, the epitaxial semiconductor being a selective, lateral epitaxial overgrowth (LEO) that mimics the crystal orientation of the substrate electrode; and
    a nanowire bridging between respective surfaces of the substrate electrode and the ledge electrode.

2. The nanowire-based device of claim 1, further comprising an isolation layer embedded between the substrate electrode and the ledge electrode to provide electrical isolation.

3. The nanowire-based device of claim 1, wherein the crystal orientation of the substrate electrode is selected from the group consisting of a [111] orientation, a [110] orientation, and a [100] orientation.

4. The nanowire-based device of claim 1, wherein the substrate electrode and the ledge electrode independently comprise a semiconductor material selected from the group consisting of group IV, group III-V and group II-VI semiconductor materials.

5. The nanowire-based device of claim 4, wherein the semiconductor material comprises compound semiconductor materials.

6. The nanowire-based device of claim 1, wherein the ledge electrode is electrically isolated from the substrate electrode by an insulating material.

7. The nanowire-based device of claim 6, wherein the insulating material is selected from the group consisting of an oxide, a carbide, a nitride, and an oxynitride.

8. The nanowire-based device of claim 1, wherein the nanowire comprises a material selected from the group consisting of a metal and a semiconductor.

9. The nanowire-based device of claim 8, wherein the metal material is selected from the group consisting of titanium (Ti), titanium-silicide (TiSi2), bismuth (Bi), tellurium (Te), lead (Pb), aluminum (Al), palladium (Pd), platinum (Pt), and copper (Cu), and alloys thereof.

10. The nanowire-based device of claim 8, wherein the semiconductor material is selected from the group consisting of group IV, group III-V and group II-VI semiconductor materials, and compounds thereof.

11. The nanowire-based device of claim 10, wherein the semiconductor material is selected from the group consisting of silicon (Si), germanium (Ge), indium phosphide (InP), and gallium arsenide (GaAs).

12. The nanowire-based device of claim 1, wherein the nanowire is a carbon nanotube.

13. The nanowire-based device of claim 1, further comprising an insulating layer between the substrate electrode and the ledge electrode that electrically isolates the substrate electrode from the ledge electrode.

14. The nanowire-based device of claim 1, wherein the substrate electrode comprises a bulk semiconductor wafer.

15. The nanowire-based device of claim 1, further comprising a semiconductor-on-insulator wafer, the substrate electrode being a semiconductor layer of the semiconductor-on-insulator wafer.

16. The nanowire-based device of claim 1, wherein the ledge electrode is physically spaced apart from the substrate electrode by an insulating layer.

17. The nanowire-based device of claim 1, wherein the epitaxial semiconductor comprises a stem portion that physically connects between the substrate electrode and the ledge electrode, the stem portion comprising an embedded isolation layer that electrically isolates the substrate electrode from the ledge electrode.

18. A nanowire-based device having isolated electrodes comprising:

a substrate electrode having a crystal orientation;

a ledge electrode that is an epitaxial semiconductor having the crystal orientation of the substrate electrode;

an isolation layer embedded between the substrate electrode and the ledge electrode to provide electrical isolation; and a nanowire bridging between respective surfaces of the substrate electrode and the ledge electrode.

* * * * *

UNITED STATES PATENT AND TRADEMARK OFFICE
CERTIFICATE OF CORRECTION

PATENT NO. : 7,928,568 B2
APPLICATION NO. : 12/476671
DATED : April 19, 2011
INVENTOR(S) : Shashank Sharma et al.

Page 1 of 1

It is certified that error appears in the above-identified patent and that said Letters Patent is hereby corrected as shown below:

In column 16, line 51, in Claim 9, delete "(TiSi2)," and insert -- $(TiSi_2)$, --, therefor.

Signed and Sealed this
Twenty-ninth Day of November, 2011

David J. Kappos
*Director of the United States Patent and Trademark Office*